United States Patent
Lee

(10) Patent No.: US 7,394,533 B2
(45) Date of Patent: Jul. 1, 2008

(54) MANUFACTURE DEFECT ANALYZER WITH DETECTING FUNCTION AND INSPECTING METHOD THEREOF

(75) Inventor: Yuan-Chiang Lee, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 351 days.

(21) Appl. No.: 11/376,330

(22) Filed: Mar. 16, 2006

(65) Prior Publication Data

US 2006/0221339 A1    Oct. 5, 2006

(30) Foreign Application Priority Data

Mar. 29, 2005    (TW) ............................. 94109895 A

(51) Int. Cl.
*G01N 21/00* (2006.01)
(52) U.S. Cl. .................................. 356/237.2; 324/755
(58) Field of Classification Search ... 356/237.1–237.5, 356/394; 324/755, 158.1
See application file for complete search history.

(56) References Cited

U.S. PATENT DOCUMENTS 4,264,202 A * 4/1981 Gugliotta et al. ......... 356/237.1
6,388,457 B1 * 5/2002 Loh et al. ................... 324/755

\* cited by examiner

*Primary Examiner*—Hoa Q Pham
(74) *Attorney, Agent, or Firm*—Rabin & Berdo, PC

(57) ABSTRACT

A manufacture defect analyzer (MDA) with a detecting function and inspecting method thereof are provided. The manufacture defect analyzer with a detecting function is for checking a to-be-inspected circuit board comprising a socket. The socket has an upper cover. The manufacture defect analyzer comprises a carrier, a detecting apparatus and an analyzer. The carrier is for supporting the to-be-inspected circuit board. The detecting apparatus corresponds to the socket and is disposed on the carrier and detects whether the upper cover is open. If the upper cover is open, then an open signal is outputted. After receiving the open signal, the analyzer is electrically connected to the socket to check whether the socket has any manufacture defect or not.

14 Claims, 5 Drawing Sheets

MANUFACTURE DEFECT ANALYZER WITH DETECTING FUNCTION AND INSPECTING METHOD THEREOF

This application claims the benefit of Taiwan application Serial No. 94109895, filed Mar. 29, 2005, the subject matter of which is incorporated herein by reference.

BACKGROUND OF THE INVENTION

1. Field of the Invention

The invention relates in general to a manufacture defect analyzer and the method thereof, and more particularly to a manufacture defect analyzer with detecting function and the inspecting method thereof.

2. Description of the Related Art

FIG. 1A is a structural diagram of a conventional manufacture defect analyzer. Manufacture defect analyzer (MDA) 100, which comprises a carrier 110 and an analyzer 120, is used for checking a to-be-inspected circuit board 140 such as a CPU motherboard complying with the LGA775 specification of Intel Corporation. The carrier 110 is used for supporting the to-be-inspected circuit board 140. The to-be-inspected circuit board 140 comprises a socket 142 for receiving an LGA775 CPU. The socket 142 has a plurality of pins and an upper cover 141 for protecting the pins. The upper cover 141 can be opened and closed. During the inspection, the analyzer 120 is lowered to be is electrically connected to the socket 142 to check whether the socket 142 has any manufacture defect or not.

Referring to FIGS. 1B, 1C and 1D, side views of the conventional manufacture defect analyzer are shown. Under standard operation procedure (SOP), the manufacture defect analyzer 100 comprises two steps. Firstly, the upper cover 141 of the to-be-inspected circuit board 140 is opened and placed on the carrier 110 as shown in FIG. 1B. Next, the analyzer 120 is switched on so that the analyzer 120 starts to lower down to be electrically connected to the pins of the socket 142 (shown in FIG. 1C).

However, as shown in FIG. 1D, during the descending of the analyzer 120, the operator may forget to open the upper cover 141 or the opened upper cover 141 may fall to cover the socket 142 again due to vibration or negligence. On one hand, the probe 121 of the analyzer 120 may collide with the upper cover 141, causing damage to the analyzer 120 or the to-be-inspected circuit board 140. On the other hand, the operator may be injured trying to open the upper cover 141 during the descending of the analyzer 120.

SUMMARY OF THE INVENTION

It is therefore an object of the invention to provide a manufacture defect analyzer with a detecting function and inspecting method thereof.

The invention achieves the above-identified object by providing a manufacture defect analyzer with a detecting function for checking the to-be-inspected circuit board of the socket having an upper cover. The manufacture defect analyzer with a detecting function comprises a carrier, a detecting apparatus and an analyzer. The carrier is for supporting the to-be-inspected circuit board. The detecting apparatus corresponds to socket and is disposed on the carrier to check whether the upper cover is opened to a to-be-inspected position. If yes, an open signal is outputted. After receiving the open signal, the analyzer is electrically connected to the socket to check whether the socket has any manufacture defect or not.

The invention achieves the above-identified object by further providing an inspecting method of a manufacture defect analyzer with a detecting function. Firstly, a to-be-inspected circuit board is placed into the manufacture defect analyzer. The to-be-inspected circuit board comprises a socket, the socket has an upper cover, and the manufacture defect analyzer comprises a detecting apparatus and an analyzer. Next, the detecting apparatus is employed to check whether the upper cover is opened to the to-be-inspected position or not. If yes, then an open signal is outputted. Lastly, after the open signal is received by the analyzer, the analyzer is driven to check whether the socket has any manufacture defect or not.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
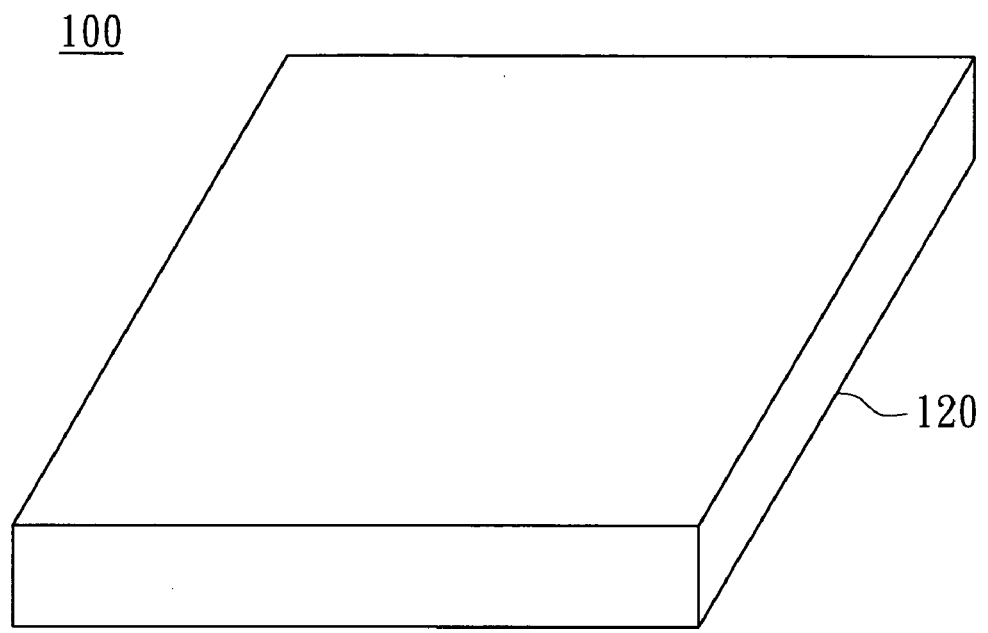
FIG. 1A is a structural diagram of a conventional manufacture defect analyzer.
Figure 1A:
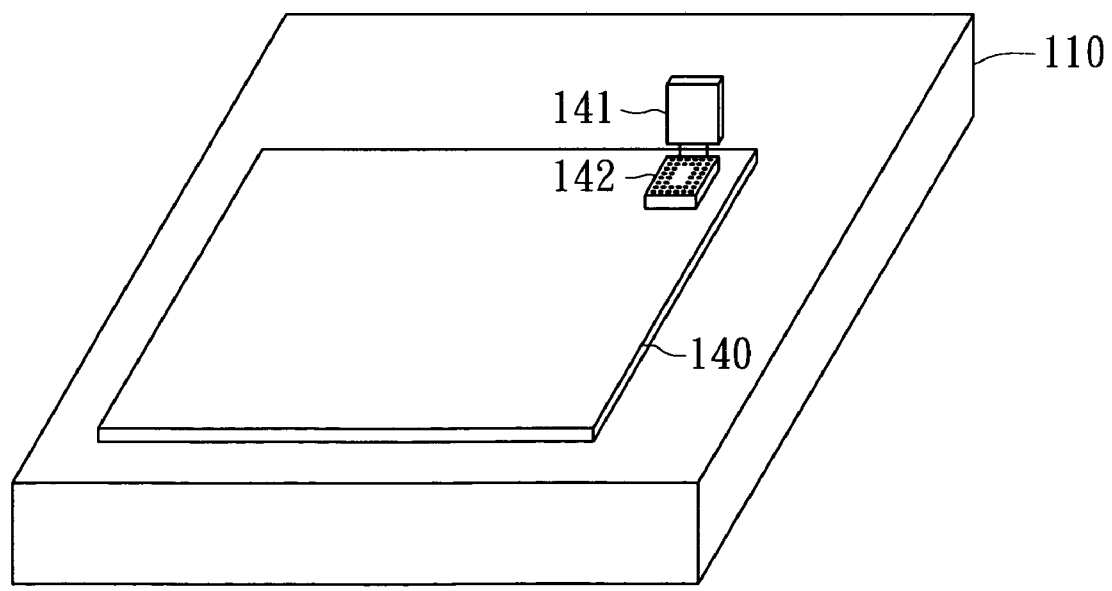
Figure 1B:
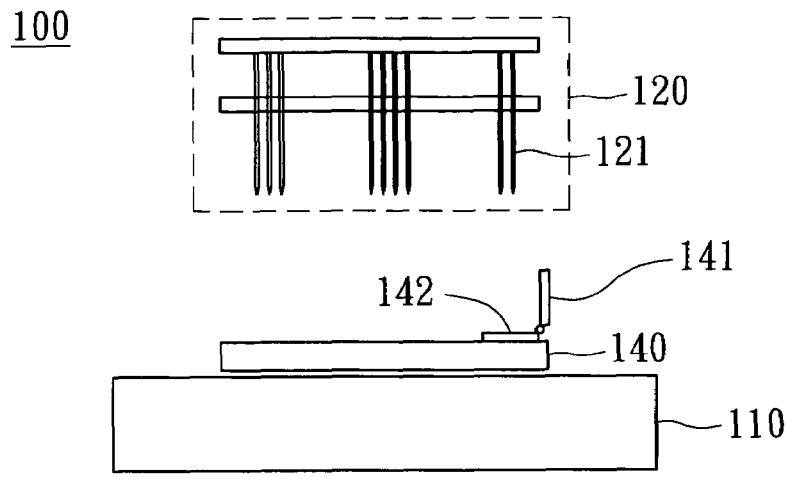
FIGS. 1B, 1C and 1D are side views of the conventional manufacture defect analyzer.
Figure 1C:
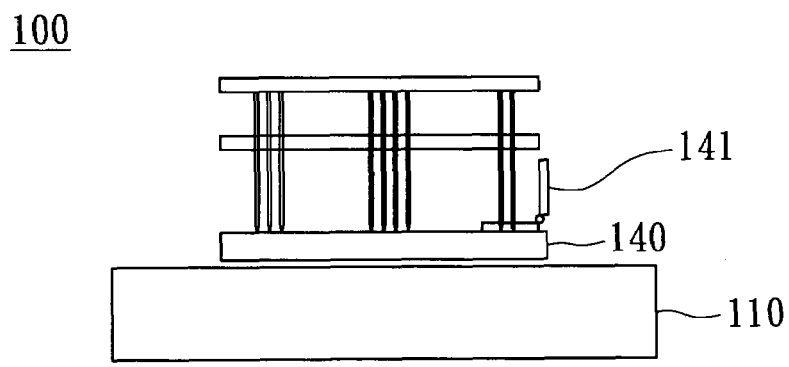
Figure 1D:
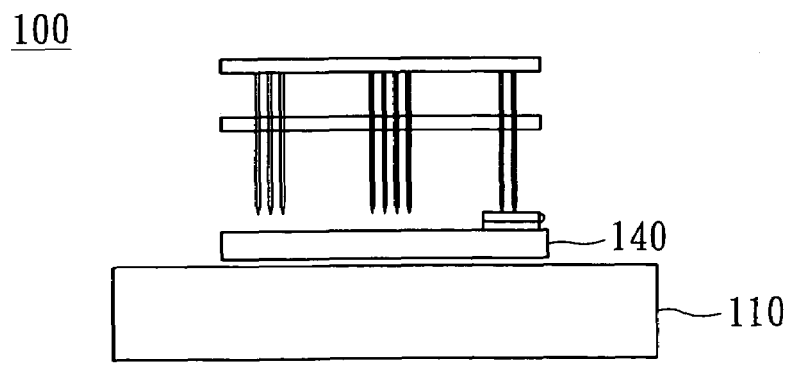
Figure 2:
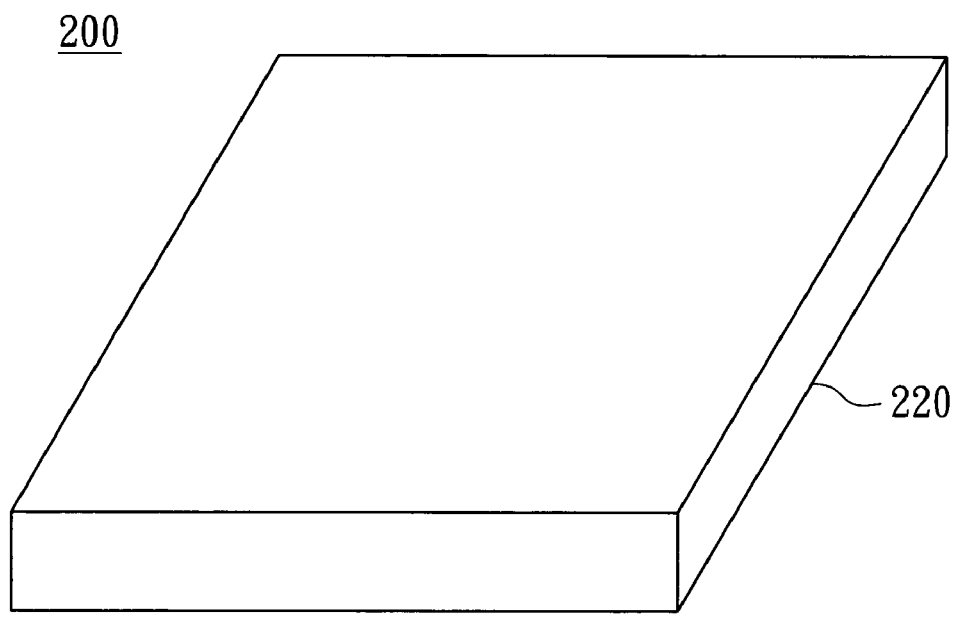
FIG. 2 is a structural diagram of a manufacture defect analyzer with a detecting function according to the invention a preferred embodiment.
Figure 2:
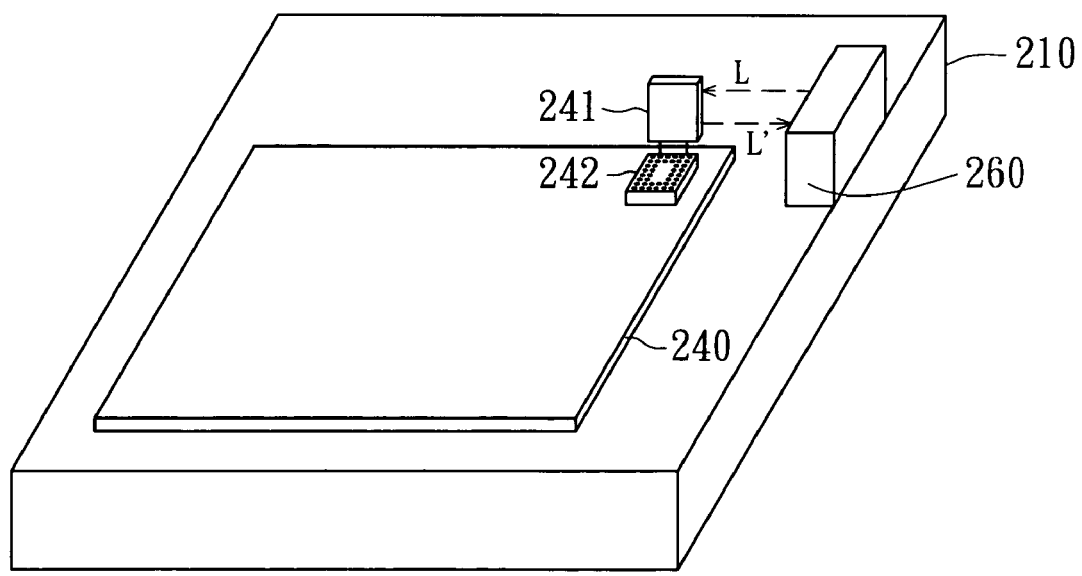

Referring to FIG. 2, a structural diagram of a manufacture defect analyzer with a detecting function according to the invention a preferred embodiment is shown. Manufacture defect analyzer 200 is for checking a to-be-inspected circuit board 240, such as a CPU motherboard complying with the LGA775 specification of Intel Corporation for instance. The to-be-inspected circuit board 240 comprises a socket 242 for receiving the CPU. The socket 242 has a plurality of pins are protected by an upper cover 241. The upper cover 241 can be opened and closed. The manufacture defect analyzer 200 with a detecting function comprises a carrier 210, a detecting apparatus 260 and an analyzer 220. The carrier 210 is for supporting the to-be-inspected circuit board 240. The detecting apparatus 260 can be corresponding to the socket 242 to be disposed over the carrier 210 to check whether the upper cover 241 is opened to a to-be-inspected position. The detecting apparatus 260 outputs an open signal when the upper cover 241 rotates to be opened to the to-be-inspected position. At the initial state, the analyzer 220 corresponds to be disposed over the carrier 210 and keeps a fixed distance from the carrier 210. Once the open signal is received by the analyzer 220, the analyzer 220 starts to move towards the carrier 210 until the analyzer 220 is electrically connected to the socket 242 to check whether the socket 242 has any manufacture defect or not.

Furthermore, the detecting apparatus 260 emits a light L. The light L generates a reflected light L' when the upper cover 241 is opened to the to-be-inspected position. After receiving the reflected light L', the detecting apparatus 260 transmits an open signal to activate the operation of the analyzer 220.

Before the upper cover 241 is opened to the to-be-inspected position, the detecting apparatus 260 would not receive the reflected light L', and the analyzer 220 would not be driven.

Figure 3A:
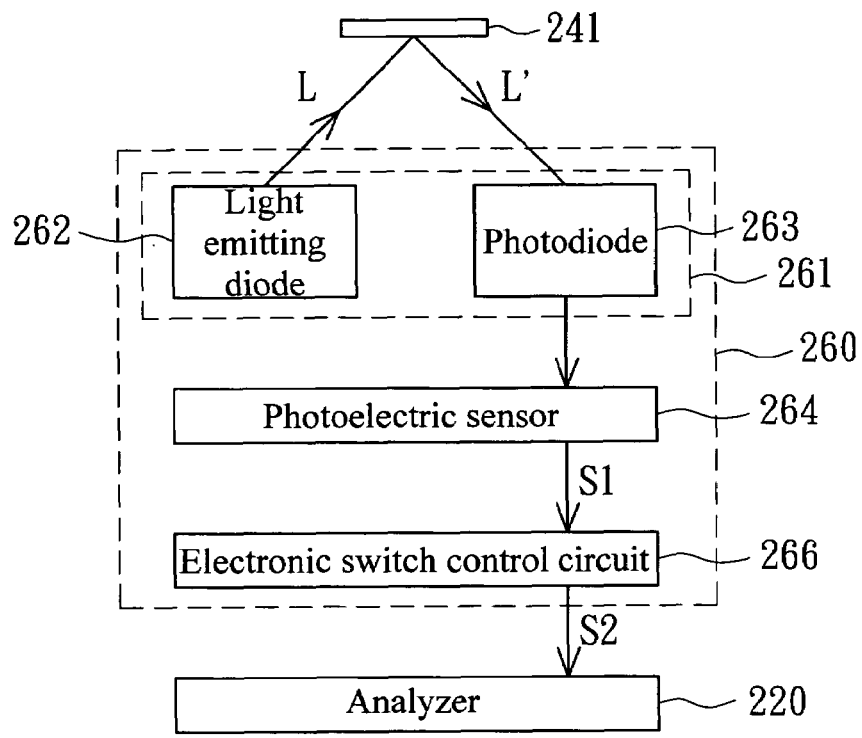
FIG. 3A is a diagram of an embodiment of a detecting apparatus.

Referring to FIG. 3A, a diagram of an embodiment of a detecting apparatus is shown. For example, the detecting apparatus 260 comprises a photo-transmitter 261, a photoelectric sensor 264 and an electronic switch control circuit 266. The photo-transmitter 261 such as a sensing optical fiber for instance comprises a light emitting diode 262 and a photodiode 263. The light emitting diode 262 is for emitting the light L. When the upper cover 241 is opened, the light L generates a reflected light L' through the upper cover 241. When the reflected light L' is received by the photodiode 263, a determining signal S1 is outputted by the photoelectric sensor 264. The electronic switch control circuit 266 outputs an open signal S2 according to determining signal S1. The analyzer 220 corresponds to be disposed over the socket 242. After receiving the open signal S2, the analyzer 220 starts to move towards the carrier 210 until the analyzer 220 is electrically connected to the socket 242 to check whether the socket 242 has any manufacture defect or not.

Figure 3B:
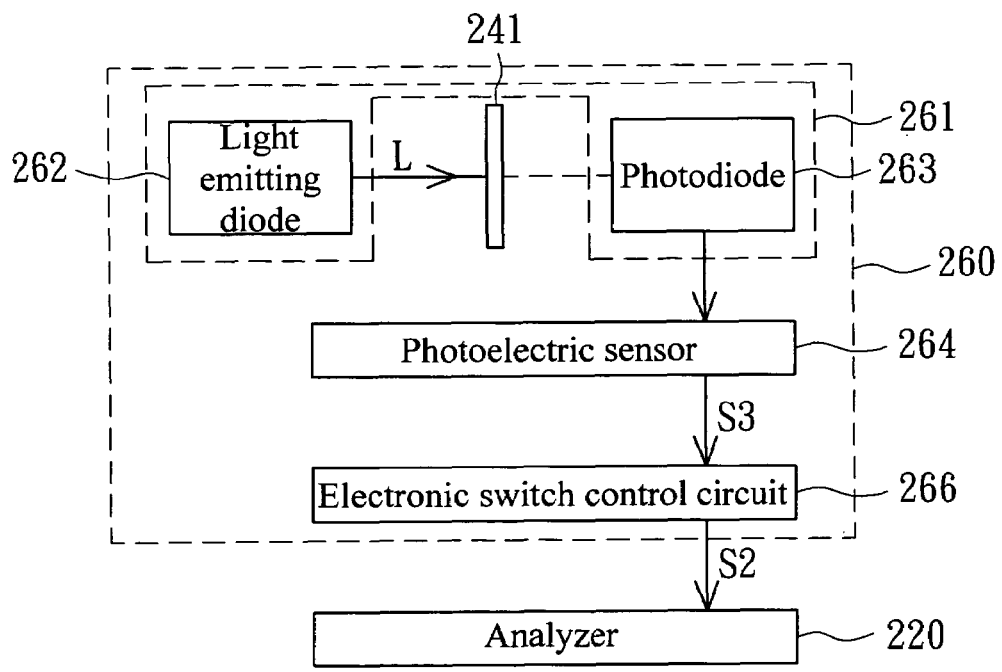
FIG. 3B is a diagram of another embodiment of a detecting apparatus.

Referring to FIG. 3B, a diagram of another embodiment of a detecting apparatus is shown. In FIG. 3A, the light emitting diode 262 and the photodiode 263 are disposed at the same side of the upper cover 241. According to the detecting apparatus 260 in FIG. 3B, the light emitting diode 262 and the photodiode 263 of the photo-transmitter 261 are disposed to be corresponding to the two sides of the upper cover 241 respectively. When the light L is received by the photodiode 263, it is implied that the upper cover 241 is not opened to the to-be-inspected position, so the detecting apparatus 260 does not transmit an open signal S2. When the photodiode 263 can not receive the light L due to the light L outputted by the light emitting diode 262 being blocked by the opened upper cover 241, the photoelectric sensor 264 outputs a blocking signal S3 which is in turn converted into an open signal S2 by the electronic switch control circuit 266. After receiving the open signal, the analyzer 220 starts to descend for the probe of the analyzer to be electrically connected to the socket 242 to check whether the socket 242 has any manufacture defect or not.

Figure 4:
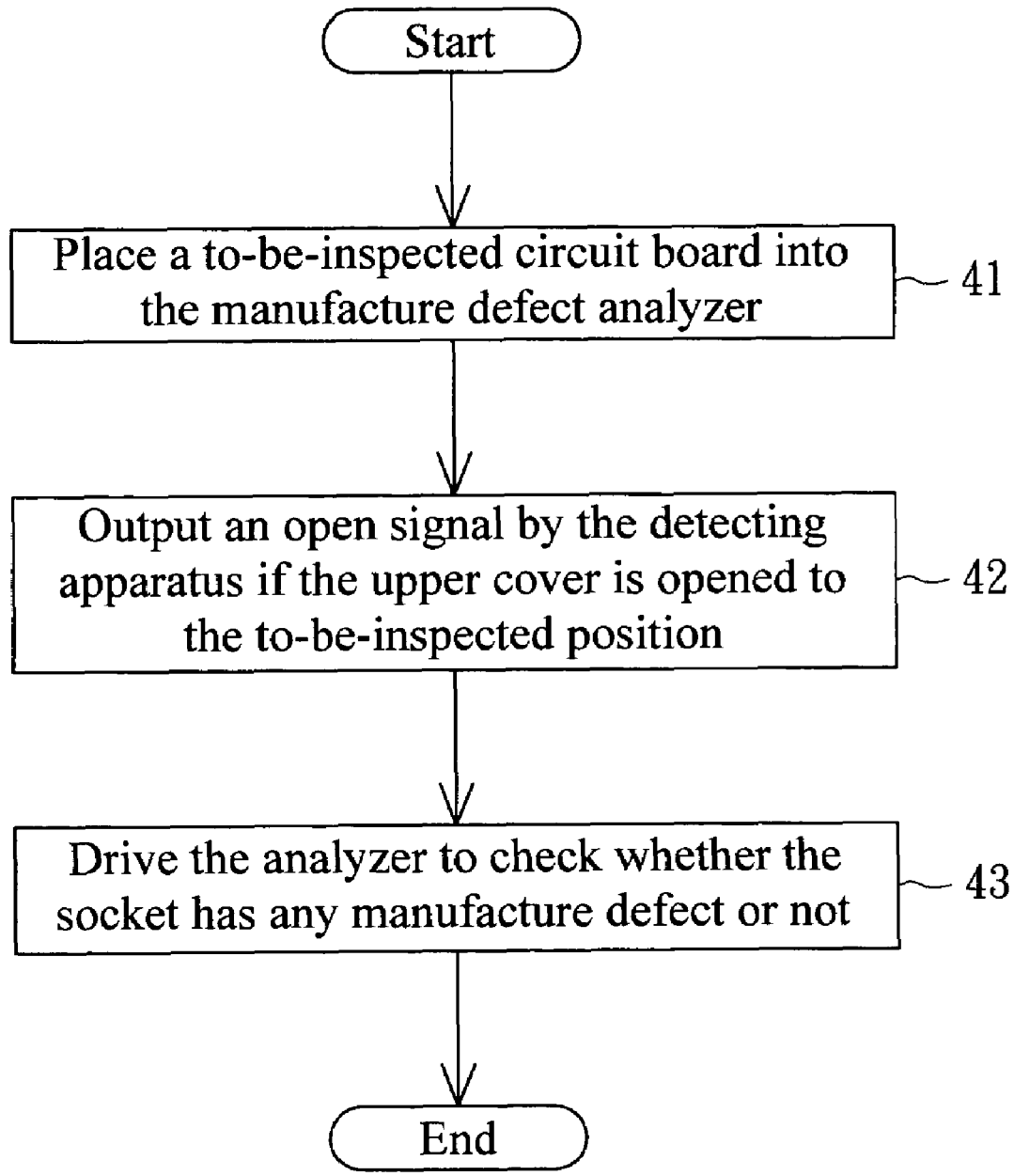
FIG. 4 is a flowchart of an inspecting method for a manufacture defect analyzer with a detecting function according to a preferred embodiment of the invention.

Referring to FIG. 4, a flowchart of an inspecting method for a manufacture defect analyzer with a detecting function according to a preferred embodiment of the invention is shown. The inspecting method for the manufacture defect analyzer comprises three steps. Firstly, as shown in step 41, a to-be-inspected circuit board 240 is placed into the manufacture defect analyzer 200. Next, as shown in step 42, a detecting apparatus 260 is employed to check whether the upper cover 241 is opened to the to-be-inspected position or not. If yes, an open signal is outputted. Lastly, as shown in step 43, after the open signal is received by the analyzer 220, the analyzer 220 is driven to check whether the socket 242 has any manufacture defect or not.

According to the manufacture defect analyzer with a detecting function and inspecting method thereof disclosed in above embodiments of the invention, the detecting apparatus detects whether the upper cover of the CPU socket of the motherboard is open or closed before the analyzer is driven. Only after the upper cover of the CPU socket is opened to the to-be-inspected position will the analyzer be driven to analyze whether the socket has any manufacture defect or not. The analyzer does not descend when the upper cover of the CPU socket is still closed, lest the parts might be damaged or the operator might be injured.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacture defect analyzer for checking a to-be-inspected circuit board, wherein the to-be-inspected circuit board comprises a socket having an upper cover, the manufacture defect analyzer comprising:

a carrier for supporting the to-be-inspected circuit board;

a detecting apparatus for checking whether the upper cover is opened to a to-be-inspected position, and outputting an open signal if yes; and an analyzer;

wherein, after receiving the open signal, the analyzer is driven to be electrically connected to the socket to check whether the socket has any manufacture defect or not.

2. The manufacture defect analyzer according to claim 1, wherein the detecting apparatus comprises:

a photo-transmitter for emitting and receiving a light, wherein when the upper cover is opened to the to-be-inspected position, a reflected light is generated from the light through the upper cover and then received by the photo-transmitter;

a photoelectric sensor outputting a determining signal when the photo-transmitter receives the reflected light; and an electronic switch control circuit outputting the open signal according to the determining signal.

3. The manufacture defect analyzer according to claim 2, wherein the photo-transmitter is a sensing optical fiber.

4. The manufacture defect analyzer according to claim 2, wherein the photo-transmitter comprises:

a light emitting diode for emitting the light; and a photodiode for receiving the reflected light.

5. The manufacture defect analyzer according to claim 1, wherein the analyzer corresponding to be disposed over the socket is driven to descend to be electrically connected to the socket after receiving the open signal.

6. The manufacture defect analyzer according to claim 1, wherein the to-be-inspected circuit board is a motherboard.

7. The manufacture defect analyzer according to claim 1, wherein the socket is a CPU socket.

8. The manufacture defect analyzer according to claim 7, wherein the CPU socket is an LGA775 CPU socket.

9. An inspecting method for manufacture defect analyzer, the method comprises:

placing a to-be-inspected circuit board into a manufacture defect analyzer, wherein the to-be-inspected circuit board comprises a socket having an upper cover;

using a detecting apparatus to check whether the upper cover is opened to a to-be-inspected position or not, and outputting an open signal if yes; and receiving the open signal by an analyzer, and then driving the analyzer to check whether the socket has any manufacture defect or not.

10. The inspecting method for manufacture defect analyzer according to claim 9, wherein the detecting apparatus comprises:

a photo-transmitter for emitting and receiving a light, wherein when the upper cover is opened to the to-be-inspected position, a reflected light is generated from the light through the upper cover and then received by the photo-transmitter;

a photoelectric sensor outputting a determining signal when the photo-transmitter receives the reflected light; and an electronic switch control circuit outputting the open signal according to the determining signal.

11. The inspecting method for manufacture defect analyzer according to claim 9, wherein the analyzer corresponding to be disposed over the socket is driven to descend to be electrically connected to the socket after receiving the open signal.

12. The inspecting method for manufacture defect analyzer according to claim 9, wherein the to-be-inspected circuit board is a motherboard.

13. The inspecting method for manufacture defect analyzer according to claim 9, wherein the socket is a CPU socket.

14. The inspecting method for manufacture defect analyzer according to claim 13, wherein the CPU socket is an LGA775 CPU socket.

* * * * *